United States Patent
Ramappa

(10) Patent No.: US 8,153,496 B1
(45) Date of Patent: Apr. 10, 2012

(54) SELF-ALIGNED PROCESS AND METHOD FOR FABRICATION OF HIGH EFFICIENCY SOLAR CELLS

(75) Inventor: Deepak Ramappa, Cambridge, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/041,724

(22) Filed: Mar. 7, 2011

(51) Int. Cl.
*H01L 21/331* (2006.01)

(52) U.S. Cl. .. 438/369; 438/364; 438/514; 257/E21.043

(58) Field of Classification Search .................. 438/141, 438/180, 181, 320, 339, 364, 369, 378; 257/E21.042, E21.043, E21.056, E21.057, 257/E21.497
See application file for complete search history.

(56) References Cited

U.S. PATENT DOCUMENTS

| | | | |
|---|---|---|---|
| 7,727,866 B2 | 6/2010 | Bateman et al. | |
| 7,776,727 B2 | 8/2010 | Borden | |
| 7,820,460 B2 | 10/2010 | Sullivan et al. | |
| 2011/0104618 A1 | 5/2011 | Bateman et al. | |

*Primary Examiner* — Cheung Lee

(57) ABSTRACT

An improved method of doping a substrate is disclosed. The method is particularly beneficial to the creation of interdigitated back contact (IBC) solar cells. A patterned implant is performed to introduce a first dopant to a portion of the solar cell. After this implant is done, an oxidation layer is grown on the surface. The oxide layer grows more quickly over the implanted region than over the non-implanted region. An etching process is then performed to remove a thickness of oxide, which is equal to the thickness over the non-implanted regions. A second blanket implant is then performed. Due to the presence of oxide on portions of the solar cell, this blanket implant only implants ions in those regions which were not implanted previously.

21 Claims, 9 Drawing Sheets

SELF-ALIGNED PROCESS AND METHOD FOR FABRICATION OF HIGH EFFICIENCY SOLAR CELLS

FIELD

This invention relates to solar cells and, more particularly, to solar cells formed using ion implantation.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

Solar cells are one example of a device that uses silicon workpieces. Any reduced cost to the manufacture or production of high-performance solar cells or any efficiency improvement to high-performance solar cells would have a positive impact on the implementation of solar cells worldwide. This will enable the wider availability of this clean energy technology.

Solar cells typically consist of a p-n semiconducting junction. FIG. 1 is a cross-sectional view of an interdigitated back contact (IBC) solar cell. In the IBC solar cell, the p-n junction is on the back or non-illuminated surface of the solar cell. Photons 10 enter the solar cell 100 through the top (or illuminated) surface, as signified by the arrows. These photons 10 pass through an anti-reflective coating 104, designed to maximize the number of photons 10 that penetrate the substrate 100 and minimize those that are reflected away from the substrate. The ARC may be comprised of an $SiN_x$ layer. Beneath the ARC 104 may be a $SiO_2$ layer 103, also known as a passivation layer. Of course, other dielectrics may be used. On the back side of the solar cell 100 is an emitter region 204.

Internally, the solar cell 100 is formed so as to have a p-n junction. This junction is shown as being substantially parallel to the top surface of the solar cell 100, although there are other implementations where the junction may not be parallel to the surface. In some embodiments, the solar cell 100 is fabricated using an n-type substrate 101. The photons 10 enter the solar cell 100 through the n+ doped region, also known as the front surface field (FSF) 102. The photons with sufficient energy (above the bandgap of the semiconductor) are able to promote an electron within the semiconductor material's valence band to the conduction band. Associated with this free electron is a corresponding positively charged hole in the valence band. In order to generate a photocurrent that can drive an external load, these electron hole (e-h) pairs need to be separated. This is done through the built-in electric field at the p-n junction. Thus, any e-h pairs that are generated in the depletion region of the p-n junction get separated, as are any other minority carriers that diffuse to the depletion region of the device. Since a majority of the incident photons are absorbed in near surface regions of the device, the minority carriers generated in the emitter need to diffuse to the depletion region and get swept across to the other side.

As a result of the charge separation caused by the presence of this p-n junction, the extra carriers (electrons and holes) generated by the photons can then be used to drive an external load to complete the circuit.

The doping pattern is alternating p-type and n-type dopant regions in this particular embodiment. The n+ back surface field 204 may be between approximately 0.1-0.7 mm in width and doped with phosphorus or other n-type dopants. The p+ emitter 203 may be between approximately 0.5-3 mm in width and doped with boron or other p-type dopants. This doping may enable the p-n junction in the IBC solar cell to function or have increased efficiency. FIG. 8 shows a commonly used pattern for the back side of the IBC solar cell. The metallic contacts or fingers 220 are all located on the bottom surface of the substrate. Certain portions of the bottom surface may be implanted with p-type dopants to create emitters 203. Other portions are implanted with n-type dopants to create more negatively biased back surface field 204. The back surface is coated with a passivating layer 210 to enhance the reflectivity of the back surface. Metal fingers 220b are attached to the emitter 203 and fingers 220a attaches to the BSF 204.

Thus, to form the IBC solar cell, two patterned doping steps may be required. These patterned doping steps need to be aligned to prevent the p+ emitter 203 and the n+ back surface field 204 from overlapping. Poor alignment or overlapping may be prevented by leaving a gap between the p+ emitter 203 and the n+ back surface field 204, but this may degrade performance of the IBC solar cell. Even when properly aligned, such patterned doping may have large manufacturing costs. For example, photolithography or hard masks (such as an oxide) may be used, but both are expensive and require extra process steps.

FIG. 2 is a block diagram of a first method to form an IBC solar cell according to the prior art. This process requires two patterned diffusion steps (shown as "Screen Print Patterned Resist") which must be well aligned to produce the pattern of FIG. 8. FIG. 8 shows one example of an IBC pattern; others include a grid, "dots", or a hexagonal pattern. FIG. 3 is a block diagram of a second method to form an IBC solar cell. This embodiment performs a first blanket diffusion. The emitter is then etched to expose underlying silicon. The etch mask and the diffusion mask can be the same, although different chemistries are used to etch the oxide mask and to dope the underlying silicon.

The embodiments of FIGS. 2-3 both require a large number of expensive process steps to form an IBC solar cell.

Therefore, there is a need in the art for an improved method of doping for solar cells and, more particularly, an improved method of doping for IBC solar cells using ion implantation.

SUMMARY

An improved method of doping a substrate is disclosed. The method is particularly beneficial to the creation of solar cells that require patterning like the interdigitated back contact (IBC) solar cells. A patterned implant is performed to introduce a first dopant to a portion of the solar cell. After this implant is done, an oxide or nitride layer is grown on the surface. The oxide or nitride layer grows more quickly over the implanted region than over the non-implanted region. An etching process is then performed to remove a thickness of oxide or nitride, which is equal to the thickness over the non-implanted regions. A second blanket implant is then performed. Due to the presence of oxide or nitride on portions of the solar cell, this blanket implant only implants ions in those regions which were not implanted previously.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments of the solar cell are described herein in connection with an ion implanter. Beamline ion implanters, plasma doping ion implanters, focused beam ion implanters, or flood ion implanters may be used. However, the gaseous diffusion, furnace diffusion, laser doping, other plasma processing tools, or other methods known to those skilled in the art also may be used. While specific n-type and p-type dopants are listed, other n-type or p-type dopants may be used instead and the embodiments herein are not limited solely to the dopants listed. Furthermore, while one particular embodiment of a solar cell (interdigitated back contact) is specifically listed, embodiments of this process may be applied to other solar cell designs or other workpieces such as semiconductor wafers or flat panels. Thus, the invention is not limited to the specific embodiments described below.

Figure 1:
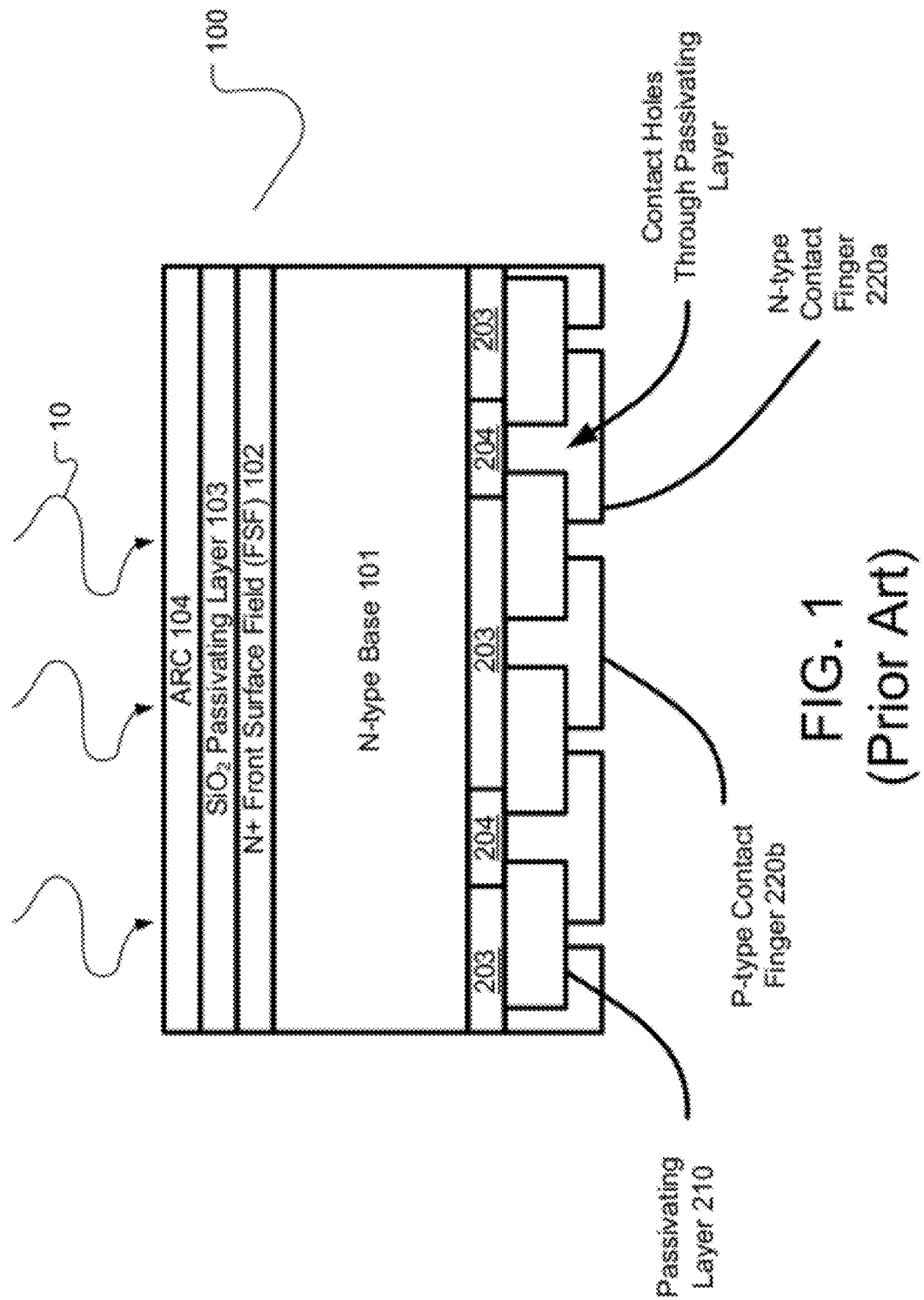
FIG. 1 is a cross-sectional view of an IBC solar cell.
Figure 2:
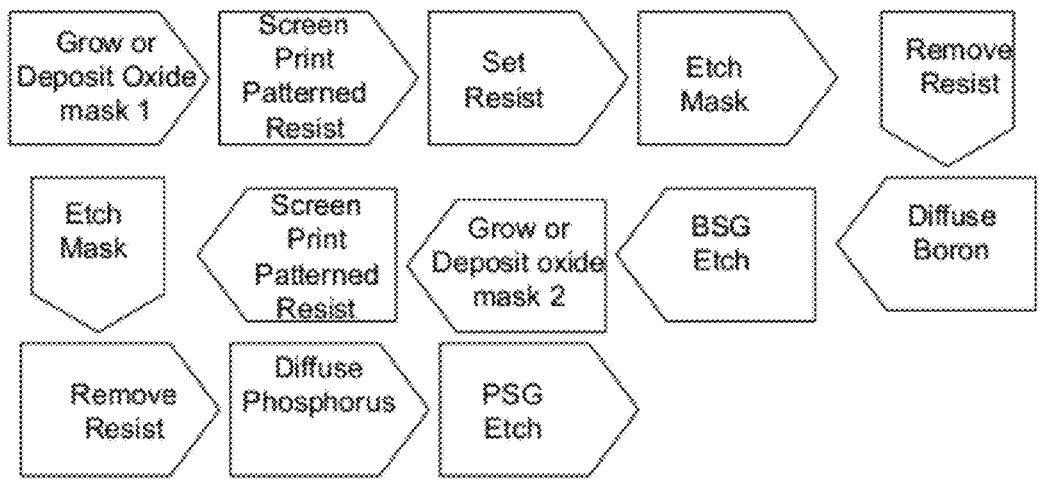
FIG. 2 is a block diagram of a first method to form an IBC solar cell according to the prior art.
Figure 3:
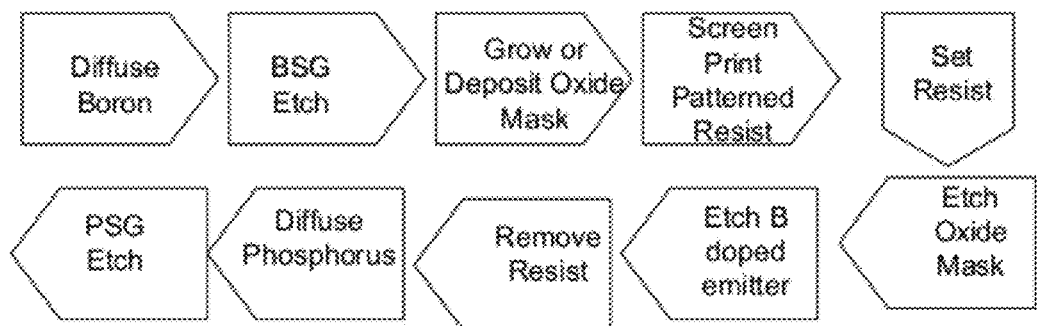
FIG. 3 is a block diagram of a second method to form an IBC solar cell according to the prior art.
Figure 4:
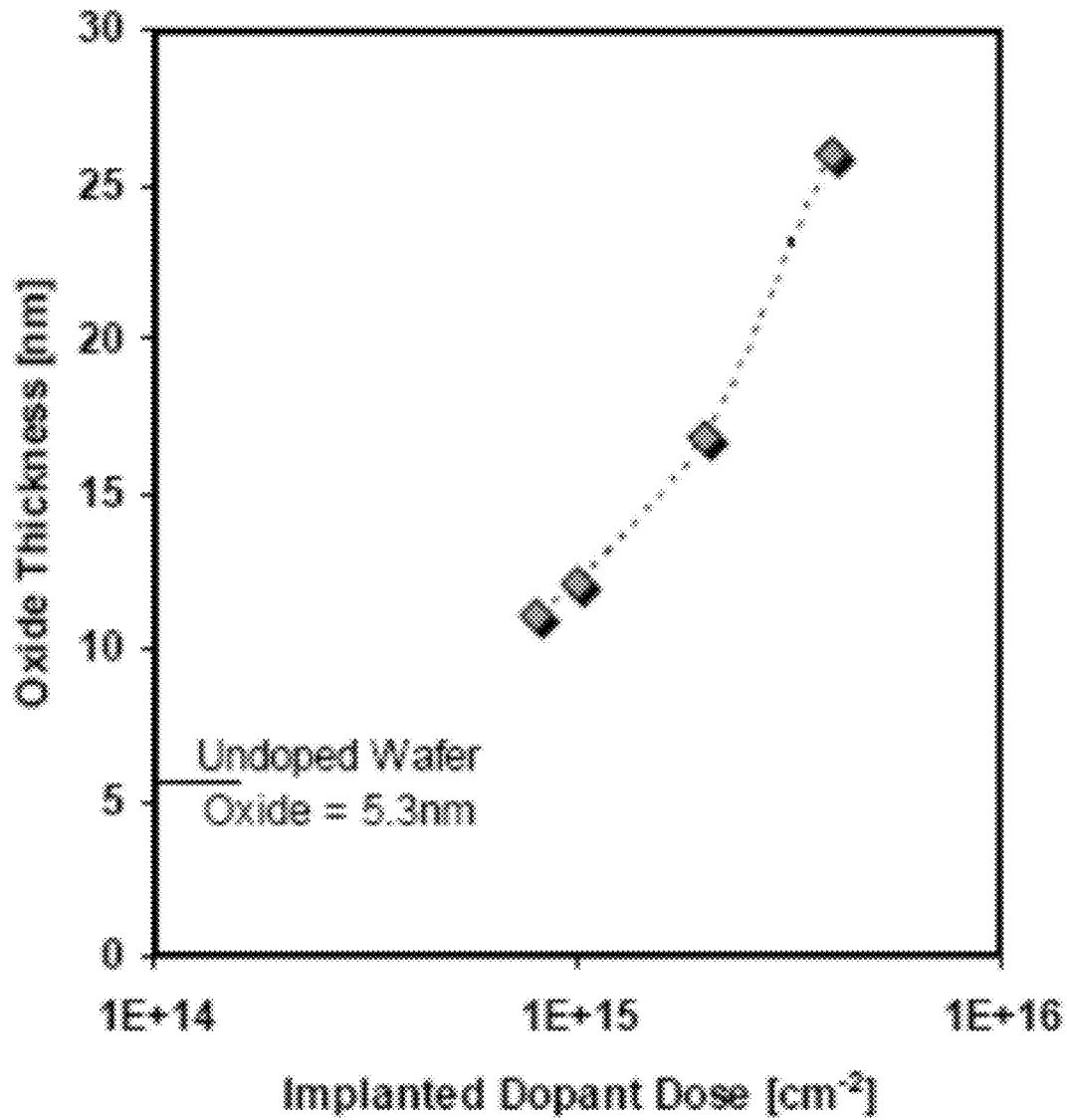
FIG. 4 is a chart showing the relationship between silicon dopant concentration and oxide thickness.

It is known that doped silicon oxidizes at a higher rate than undoped or lightly doped silicon. FIG. 4 shows the relationship between grown oxide thickness and the dopant concentration in the underlying silicon. This data is based on the following test conditions. The temperature of the environment was about 840° C., and the duration was roughly 40 minutes. As seen in FIG. 4, in this test environment an oxide thickness of 5.3 nm is grown on undoped silicon. However, as the dopant in the silicon increases, the grown oxide thickness increases as well. As dopant concentrations of $1E+15/cm^2$, the thickness is 10 nm, while at dopant concentrations approaching $1E+16/cm^2$ the thickness grows to over 25 nm. Since this grown oxide is effective at blocking ions from penetrating into the underlying silicon, this grown oxide layer can be used as a mask for subsequent process steps. Similar results can be achieved with the use of nitrogen or ammonia to produce an uneven nitride layer on the substrate.

Figure 5:
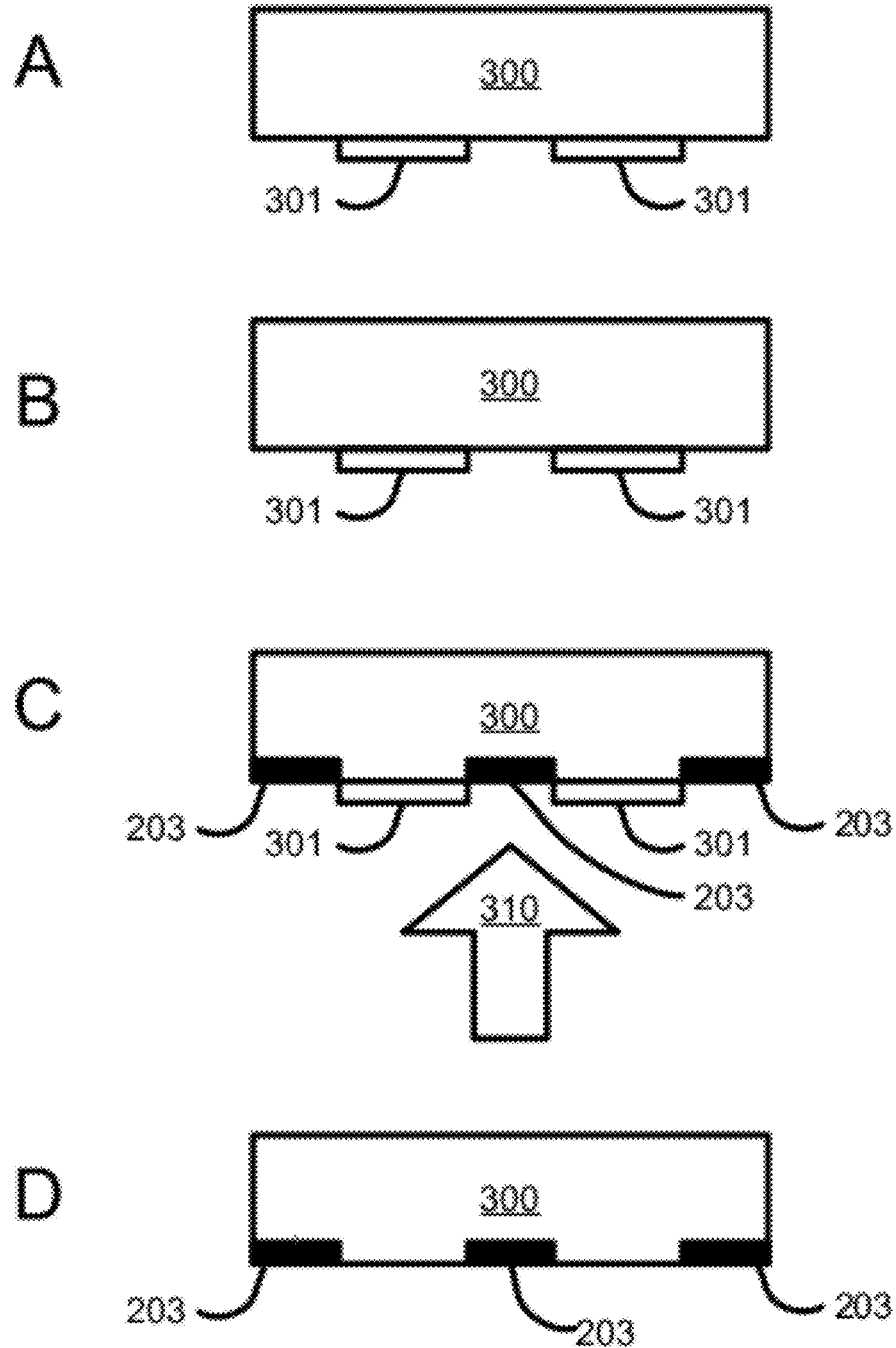
FIGS. 5A-I are cross-sectional views of a first method to form an IBC solar cell.
Figure 5:
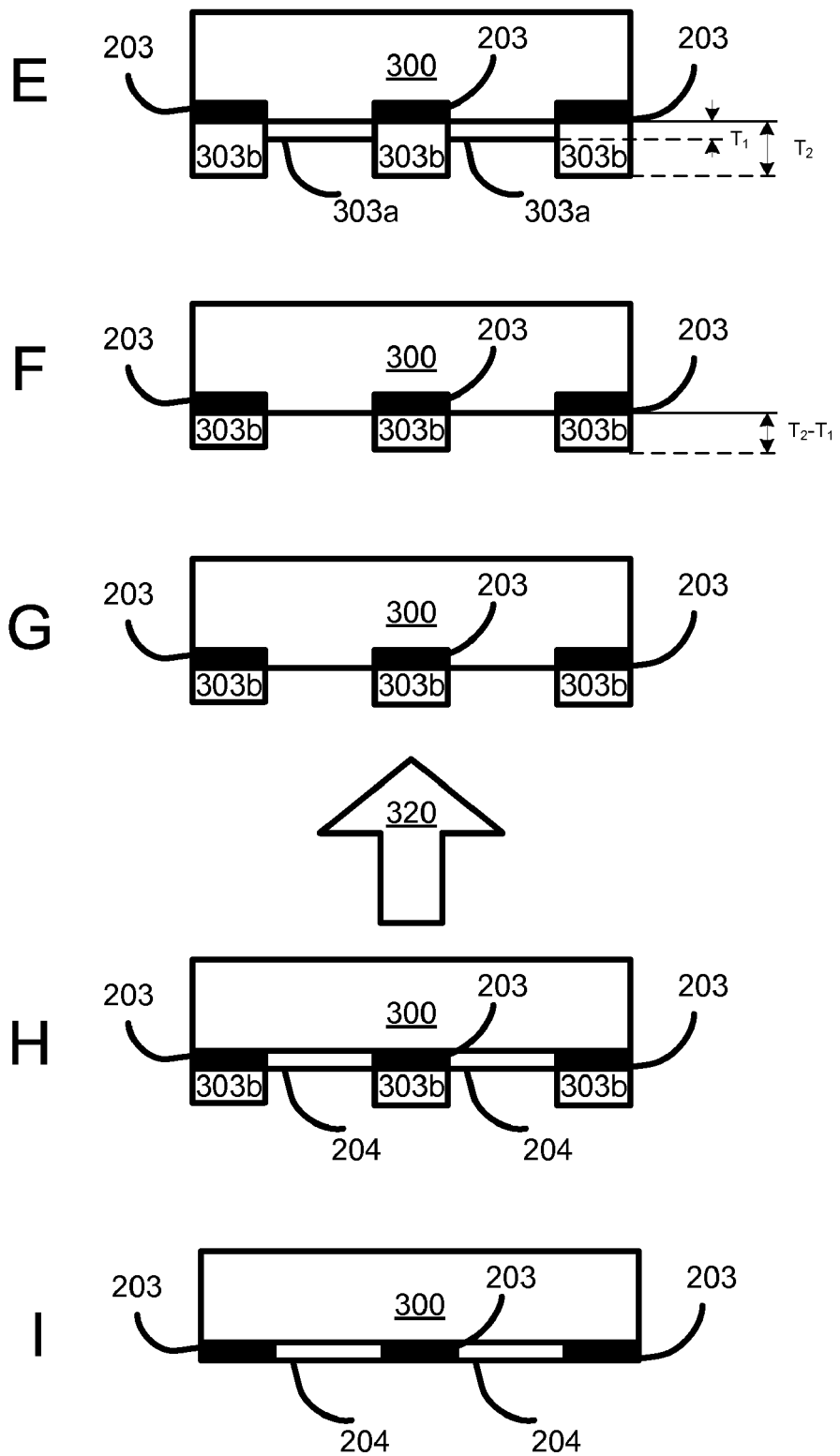

FIGS. 5A-I are cross-sectional views of a first method to form an IBC solar cell. In FIG. 5A, a substrate 300 is shown. This substrate may be an n-type substrate, such as n-silicon.

In FIG. 5B, a mask 301 is positioned between the ion beam and the substrate 300. This mask 301 is used to block a region of the substrate 300 from receiving implantation during the subsequent implant step. This mask may be any suitable mask, including a stencil, proximity or shadow mask.

In FIG. 5C, ions of a dopant of a first species 310 is introduced to the substrate 300. In some embodiments, the ions are implanted using a beam-line ion implanter. In other embodiments, other methods are used, such as plasma doping, are used. The first species 310 may be boron and may form the p+ emitter 203. In other embodiments, other Group III elements may be used as the p-type dopant. The mask 301 may serve to substantially prevent the species 310 from being implanted into the regions of the solar cell 300 beneath the mask 301.

After ions of the first species 310 have been implanted in the substrate 300, the mask is removed as shown in FIG. 5D. The substrate is subjected to a thermal process, such as an anneal cycle. The anneal cycle may operates at approximately 800-900° C. in one embodiment. The thermal process may be done in the presence of an oxidizing environment. This oxidizing environment is defined as an environment in which sufficient oxygen is present to allow the growth of an oxide layer on the substrate 300. During the thermal process, the oxide 303 grows on the surface of the substrate 300, as shown in FIG. 5E. The oxide 303a which is grown over the previously unimplanted region has a first thickness ($T_1$). The oxide 303b grown over the previously implanted emitter regions 203, has a second thickness ($T_2$). As explained above, the thickness of the oxide 303b will be greater than that of oxide 303a, due to the difference in the underlying dopant concentration in the substrate 300.

In another embodiment, the thermal process is preformed in an environment conducive to the growth of a nitride layer, such as an environment containing nitrogen or ammonia. It is understood that while the disclosure describes the creation and subsequent etching of an oxide layer 303, this technique is equally applicable to a nitride layer. Thus, the thermal process is performed in an environment conducive to the growth of a film, where the film is either an oxide or nitride layer.

An etching process, such as a controlled isotropic oxide wet-etch, is then performed. The purpose of this etch is to remove a fixed thickness of oxide from the surface of the substrate 300. The thickness of oxide to be removed is substantially equal to the thickness of oxide 303a. In one embodiment, a dilute buffered hydrofluoric (HF) acid is used, which etches slower and allows better thickness control than other acids. Of course, other acids may be used. In other embodiments, this etch may be a plasma etch or any other etch chemistry. The result, shown in FIG. 5F, is that no oxide exists over the previously unimplanted regions, while a layer of oxide 303b still remains on previously implanted emitter regions 203. The thickness of the remaining oxide may be approximately equal to $T_2-T_1$.

Ions of a dopant of a second species 320 are then blanket implanted into the substrate 300, as shown in FIG. 5G. As described above, the ions of the second species 320 may be introduced using a beam-line implanter, a plasma doping system, or any other suitable means. The second species 320 may be an n-type dopant, such as phosphorus, or any other Group V element. This blanket implant of second species 320 may be used to create n+ back surface fields 204, as shown in FIG. 5H.

The remaining oxide 303b is then removed with a second etching step, as shown in FIG. 5I. Less precision may be required in this etching process, so a less expensive and time-consuming process may be employed. In other embodiments, the same etching process as was used above is employed.

Figure 6:
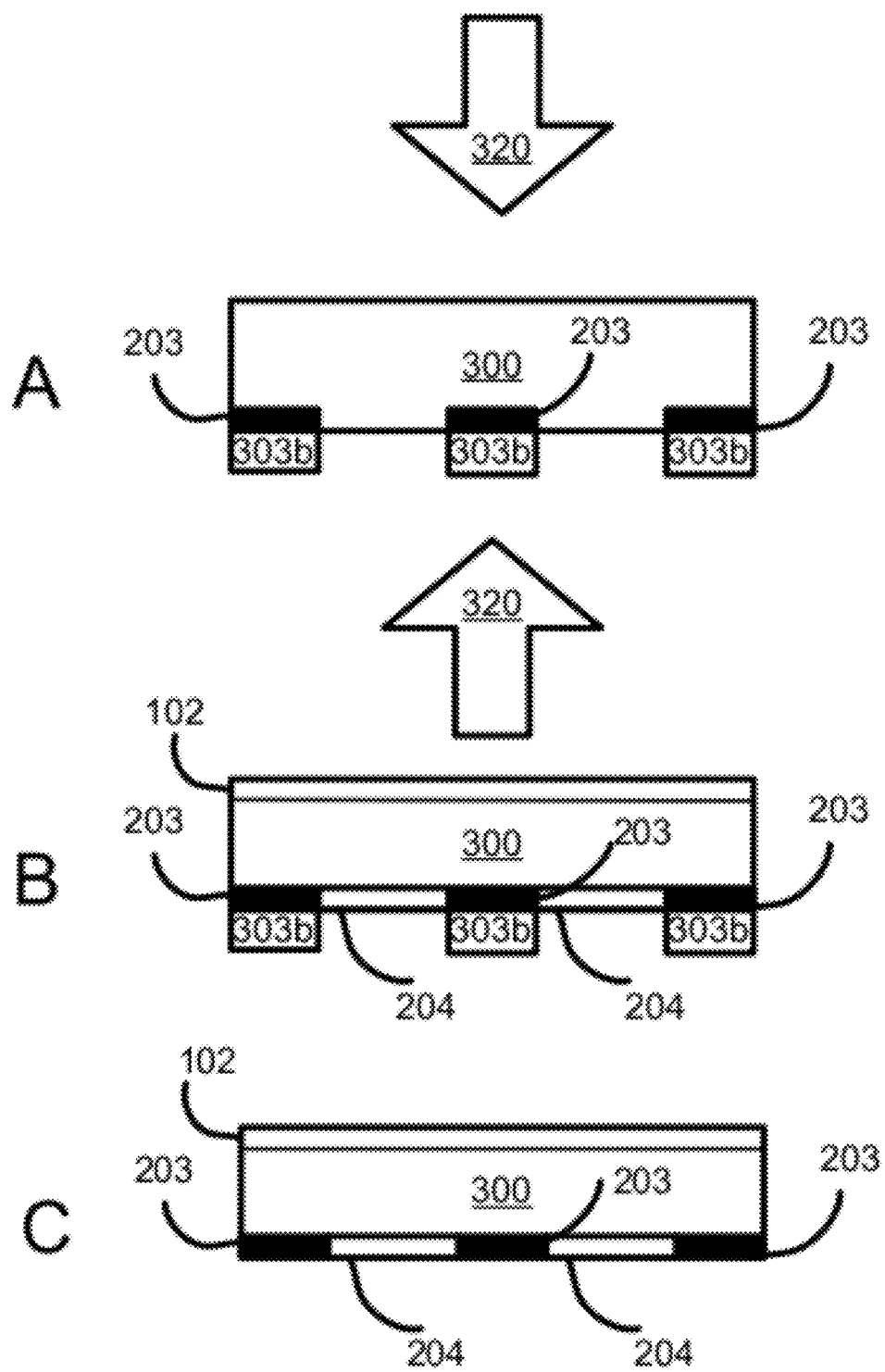
FIGS. 6A-C are cross-sectional views of a second method to form an IBC solar cell.

In some embodiments, this blanket implant of second species 320, shown in FIG. 5G, can be used to implant both surfaces of the substrate 300. These blanket implants may be sequential or at least partially simultaneous. This second method is shown in FIG. 6A. In this embodiment, a species 320 of n-type dopant, such as phosphorus, is implanted on both surfaces of the substrate 300. This blanket implant results in the creation of an n+ front surface field 102 and n+ back surface fields 204, as shown in FIG. 6B.

As described above, the oxide 303b is then removed from the back side of the substrate 300, using an etching process, as seen in FIG. 6C.

While this process has been described with the p-type dopant being used as the first species 310, other embodiments are possible. For example, the first species (i.e. FIG. 5C) may be an n-type dopant, such as phosphorus. In this embodiment, the simultaneous implant of the front surface (as shown in FIG. 6A) would be performed at this point of the process. In addition, in this embodiment, the second species 320 may be a p-type dopant. Other steps of the process would remain similar.

Figure 7:
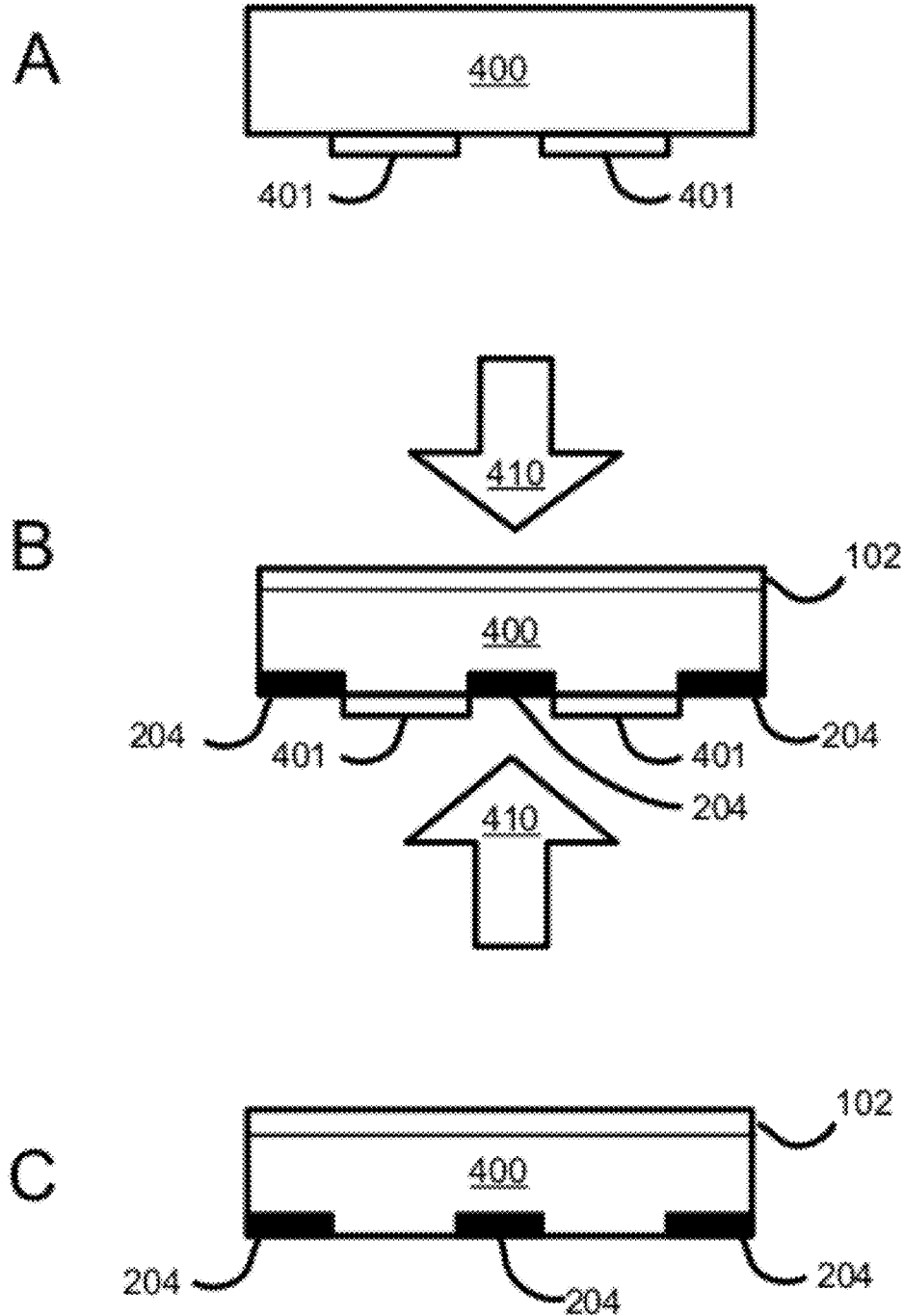
FIGS. 7A-G are cross-sectional views of a third method to form an IBC solar cell.
Figure 7:
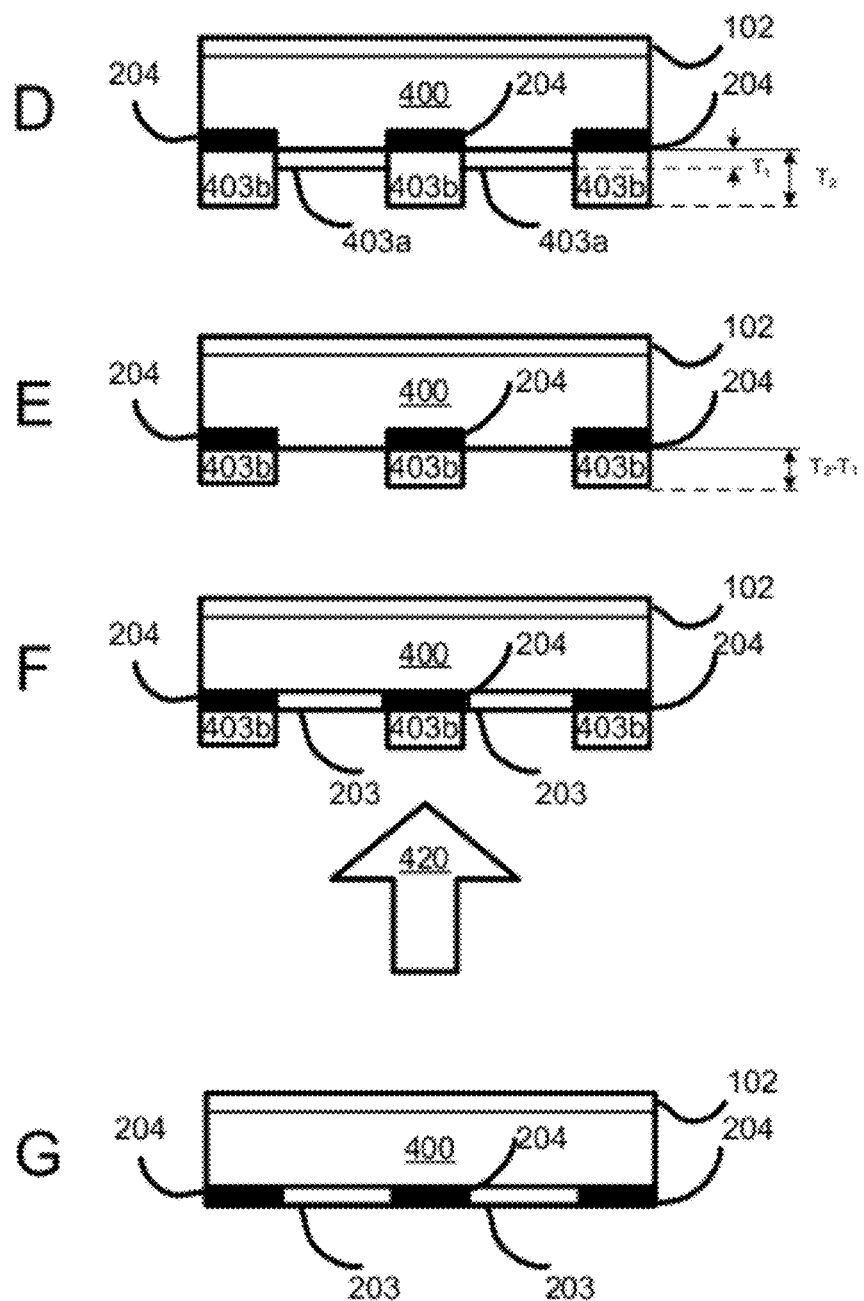
Figure 8:
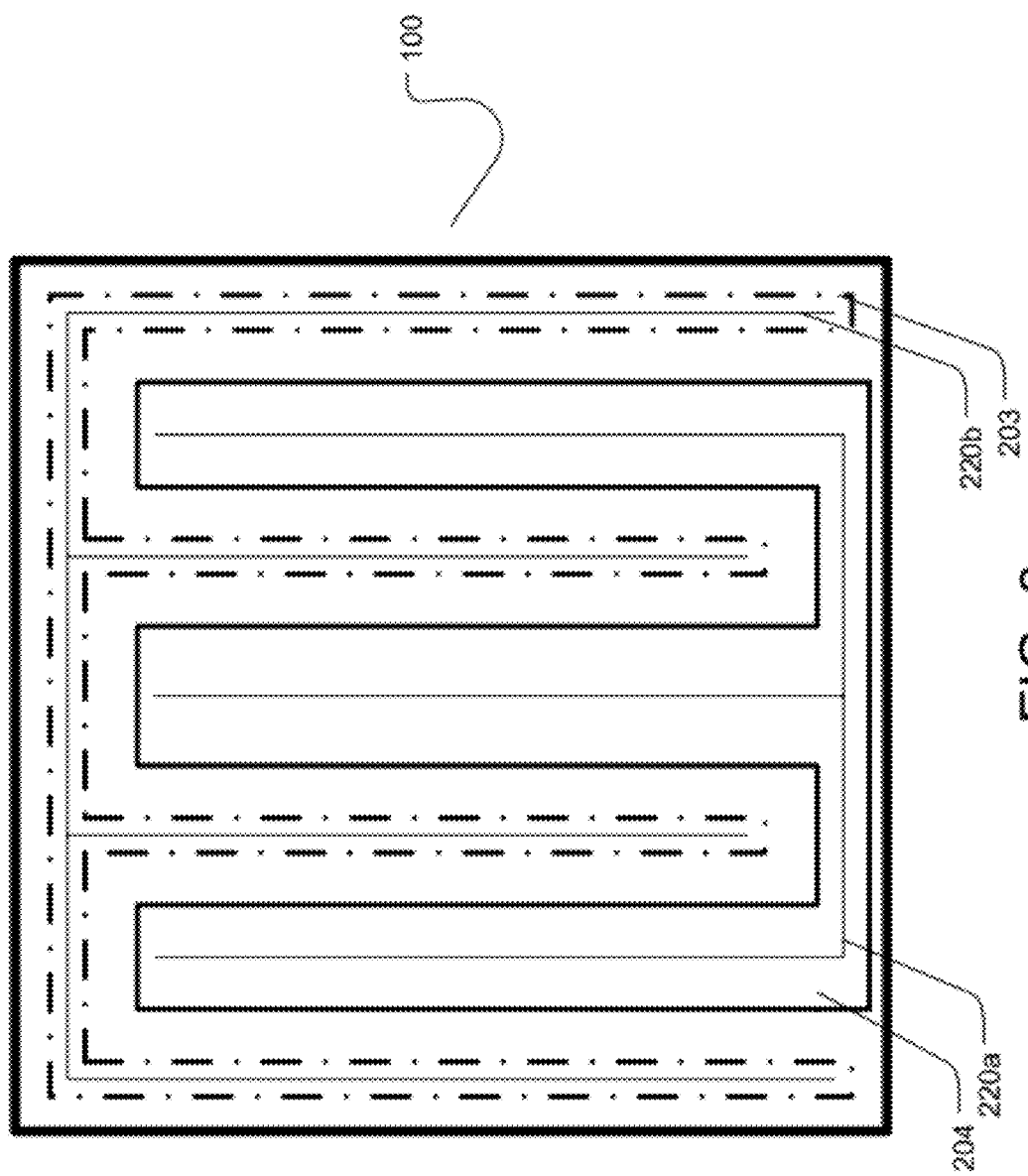
FIG. 8 is a bottom view of the IBC solar cell of FIG. 1.

In other words, this second embodiment would include the following steps, illustrated in FIG. 7. First, as shown in FIG. 7A, a mask 401 is placed over region of a substrate 400 which will subsequently become the p+ emitter 203. Second, as illustrated in FIG. 7B, an n-type dopant 410 is implanted through the mask 401 on bottom surface. It should be noted that the blanket implant of the front surface may be done at this time as well. These implants create the n+ front surface fields 102 and back surface field regions 204. Third, as shown in FIG. 7C, the mask 401 is removed and the substrate is subjected to a thermal process in an oxygen rich environment to grow oxide on the back surface. As described above, and shown in FIG. 7D, the thickness of the oxide 403b on the previously implanted regions 204 ($T_2$) is greater than the thickness of the oxide 403a on the previously unimplanted regions ($T_2$). Next, a thickness of oxide is etched from the back surface where this thickness is sufficient to expose the previously un-implanted regions, as illustrated in FIG. 7E. Next, a blanket implant of p-type dopant 420 to create the p+ emitters 203 is performed on the back surface, as shown in FIG. 7F. Finally, as illustrated in FIG. 7G, a second etch process is performed to remove remaining oxide from back surface. As noted above, the thermal process of FIG. 7C may be performed in a nitrogen rich environment or in the presence of ammonia to create a nitride layer, rather than an oxide layer.

In both cases, another oxidation process may be performed to passivate both sides of the inter-digitated back contact solar cell.

While this process describes the creation of IBC solar cells, it can be used for other processes as well. For example, while this disclosure describes species 310 and species 320 as being opposite conductivity, this is not a requirement of the present disclosure. For example, dopants of the same conductivity may be used for the two implants. This may be done when the species of the two implants differs, such as phosphorus and arsenic for n-type implants or boron and aluminum or gallium for p-type implants. Different dopants of the same conductivity may be used to take advantage of the different implant or diffusion characteristics of the various species.

In another embodiment, the same species may be used for both implants, where there is a difference in the implant parameters between the two implants. For example, the desired concentration of the two implants may be different, or the implant energy of the two implants may differ. In such a case, a patterned implant is done at the first set of operating parameters. Afterwards, the oxide is grown and etched, as described above. The blanket implant, using the same species, but different implant parameters, is then performed.

In addition, while IBC solar cells were used as an exemplary implementation of the process, other devices may also be processed in this manner. For example, conventional solar cells, or selective emitter solar cells can also be made using this process. In addition, other semiconductor devices which require alignment of one doped region to a subsequently doped region may also use this process.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of creating regions of differing conductivity on a substrate, comprising:
    covering a first region of a first surface of said substrate with a mask;
    implanting ions of a first species through said mask into a second region of said first surface of said substrate;
    performing a thermal process in a heated environment conducive to the growth of a film, where said film is an oxide or a nitride, such that film layers of different thicknesses are grown on said first surface of said substrate, wherein a second thickness on said second region is greater than a first thickness on said first region;
    subjecting said substrate to an etching process to remove an amount of oxide substantially equal to said first thickness, thereby exposing said first region while said film remains on said second region;
    implanting ions of a second species into said first region, while said film remains only on said second region; and
    removing said film from said second region.

2. The method of claim 1, wherein said first species comprises a p-type dopant and said second species comprises an n-type dopant.

3. The method of claim 2, wherein said first species comprises boron and said second species comprises phosphorus.

4. The method of claim 1, wherein said first species comprises phosphorus and said second species comprises boron.

5. The method of claim 1, wherein said method is used to create an interdigitated back contact solar cell.

6. The method of claim 5, wherein one of said first species and said second species comprises a p-type dopant and the other of said first species and said second species comprises a n-type dopant and further comprising implanting said n-type dopant in a second surface opposite said first surface.

7. The method of claim 6, wherein said second surface is implanted at least partially simultaneously with said implant of n-type dopant into said first surface.

8. A method of creating an interdigitated back contact solar cell using a substrate, comprising:
    covering a first region of a first surface of said substrate with a mask;
    implanting ions of a p-type dopant through said mask to create emitter regions on said first surface of said substrate;
    performing a thermal process in a heated environment conducive to the growth of a film, where said film is an oxide or a nitride, such that film layers of different thicknesses are grown on said first surface of said substrate, wherein a second thickness in said emitter regions is greater than a first thickness in said first region;
    subjecting said substrate to an etching process to remove an amount of film substantially equal to said first thickness, thereby exposing said first region while said film remains on said emitter regions;

implanting ions of a n-type dopant into said first region, while said film remains only on said emitter region to create back surface field regions; and removing said film from said emitter regions.

9. The method of claim 8, wherein said p-type dopant comprises boron.

10. The method of claim 8, wherein said n-type dopant comprises phosphorus.

11. The method of claim 8, further comprising implanting said n-type dopant into a second surface, opposite said first surface to create front surface fields.

12. The method of claim 11, wherein said n-type dopant is implanted in said second surface at least partially simultaneously with said implantation of said n-type dopant in said first surface.

13. The method of claim 8, further comprising performing an oxidation step on said substrate after removal of said film to passivate said first surface.

14. The method of claim 13, wherein said oxidation step is used to passivate a second surface, opposite said first surface.

15. A method of creating an interdigitated back contact solar cell using a substrate, comprising:

covering a first region of a first surface of said substrate with a mask;

implanting ions of a n-type dopant through said mask to create back surface field regions on a first surface of said substrate;

performing a thermal process in a heated environment conducive to the growth of a film, where said film is an oxide or a nitride, such that film layers of different thicknesses are grown on said first surface of said substrate, wherein a second thickness in said back surface field regions is greater than a first thickness in said first region;

subjecting said substrate to an etching process to remove an amount of film substantially equal to said first thickness, thereby exposing said first region while said film remains on said back surface field regions;

implanting ions of a p-type dopant into said first surface, while said film remains only on said back surface field regions to create emitter regions; and removing said film from said back surface field regions.

16. The method of claim 15, wherein said p-type dopant comprises boron.

17. The method of claim 15, wherein said n-type dopant comprises phosphorus.

18. The method of claim 15, further comprising implanting said n-type dopant into a second surface, opposite said first surface to create front surface fields.

19. The method of claim 18, wherein said n-type dopant is implanted in said second surface at least partially simultaneously with said implantation of said n-type dopant in said first surface.

20. The method of claim 15, further comprising performing an oxidation step on said substrate after removal of said film to passivate said first surface.

21. The method of claim 20, wherein said oxidation step is used to passivate a second surface, opposite said first surface.

\* \* \* \* \*